(12) United States Patent
Alptekin et al.

(10) Patent No.: US 9,472,406 B2
(45) Date of Patent: Oct. 18, 2016

(54) METAL SEMICONDUCTOR ALLOY CONTACT RESISTANCE IMPROVEMENT

(71) Applicant: International Business Machines Corporation, Armonk, NY (US)

(72) Inventors: Emre Alptekin, Wappingers Falls, NY (US); Nicolas L. Breil, Wappingers Falls, NY (US); Christian Lavoie, Pleasantville, NY (US); Ahmet S. Ozcan, Pleasantville, NY (US); Kathryn T. Schonenberg, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/880,429

(22) Filed: Oct. 12, 2015

(65) Prior Publication Data

US 2016/0035574 A1 Feb. 4, 2016

Related U.S. Application Data

(62) Division of application No. 14/172,526, filed on Feb. 4, 2014.

(51) Int. Cl.
*H01L 21/28* (2006.01)
*H01L 29/45* (2006.01)
(Continued)

(52) U.S. Cl.
CPC ... *H01L 21/28026* (2013.01); *H01L 21/28512* (2013.01); *H01L 21/28518* (2013.01);
(Continued)

(58) Field of Classification Search
CPC .................................................. H01L 21/28518
See application file for complete search history.

(56) References Cited

U.S. PATENT DOCUMENTS 5,726,083 A * 3/1998 Takaishi ............ H01L 27/10844
257/E21.008
6,440,828 B1 * 8/2002 Sato .................. H01L 21/28518
257/E21.165
(Continued)

FOREIGN PATENT DOCUMENTS

EP 1564799 A2 8/2005
JP 878357 A 3/1996
JP 2001223180 A 8/2001

OTHER PUBLICATIONS

International Application No. PCT/IB2015/050147, Written Opinion of the International Searching Authority dated Mar. 31, 2015, 4 pages.

(Continued)

*Primary Examiner* — Thao X Le
*Assistant Examiner* — Xia L Cross
(74) *Attorney, Agent, or Firm* — Stosch Sabo; Steven Meyers

(57) ABSTRACT

Contact openings are formed into a dielectric material exposing a surface portion of a semiconductor substrate. A first transition metal liner including at least one first transition metal element, a second transition metal liner including at least one second transition metal element that is different from the at least one first transition metal element and a metal contact are sequentially formed within each contact opening. Following a planarization process, the structure is annealed forming metal semiconductor alloy contacts at the bottom of each contact opening. Each metal semiconductor alloy contact that is formed includes the at least one first transition metal element, the at least one second transition metal element and a semiconductor element.

20 Claims, 10 Drawing Sheets

(51) Int. Cl.
  *H01L 29/78* (2006.01)
  *H01L 21/285* (2006.01)
  *H01L 29/66* (2006.01)
  *H01L 23/485* (2006.01)
  *H01L 23/532* (2006.01)
  *H01L 21/768* (2006.01)

(52) U.S. Cl.
  CPC ... *H01L21/28568* (2013.01); *H01L 21/76843* (2013.01); *H01L 21/76858* (2013.01); *H01L 23/485* (2013.01); *H01L 23/53238* (2013.01); *H01L 29/456* (2013.01); *H01L 29/66545* (2013.01); *H01L 29/78* (2013.01); *H01L 21/76855* (2013.01)

(56) References Cited

U.S. PATENT DOCUMENTS

| | | | |
|---|---|---|---|
| 6,624,489 B2 | 9/2003 | Chong et al. | |
| 7,229,920 B2 | 6/2007 | Chen et al. | |
| 7,785,972 B2 | 8/2010 | Chang et al. | |
| 7,795,124 B2 | 9/2010 | Nouri et al. | |
| 8,304,819 B2* | 11/2012 | Jung | H01L 21/28512 257/181 |
| 8,450,807 B2 | 5/2013 | Doris et al. | |
| 2007/0249149 A1 | 10/2007 | Deshpande et al. | |
| 2009/0023261 A1 | 1/2009 | Hirano | |
| 2010/0078771 A1* | 4/2010 | Barth | H01L 21/76898 257/621 |
| 2010/0320547 A1 | 12/2010 | Ando et al. | |
| 2011/0147798 A1 | 6/2011 | Radosavljevic et al. | |
| 2011/0297911 A1 | 12/2011 | Shima et al. | |
| 2012/0112292 A1 | 5/2012 | Lavoie et al. | |
| 2012/0181697 A1 | 7/2012 | Lavoie et al. | |
| 2012/0326317 A1 | 12/2012 | Wu | |
| 2013/0240990 A1* | 9/2013 | Yin | H01L 29/456 257/343 |

OTHER PUBLICATIONS

Beneyton, R., et al., "Formation of Titanium Silicide by Millisecond anneal", 18th IEEE Conference on Advanced Thermal Processing of Semiconductors, Date of Conference: Sep. 28, 2010-Oct. 1, 2010, pp. 80-85.

International Search Report and Written Opinion of the International Searching Authority dated Mar. 31, 2015 from related International Application No. PCT/IB2015/050147.

* cited by examiner

METAL SEMICONDUCTOR ALLOY CONTACT RESISTANCE IMPROVEMENT

BACKGROUND

The present application relates to semiconductor structures and methods of forming the same. More particularly, the present application relates to semiconductor structures including at least one metal semiconductor alloy contact having improved contact resistance. The present application also provides methods of forming such semiconductor structures.

Field effect transistors (FETs) are the basic building block of today's integrated circuits. Such transistors can be formed in conventional bulk substrates (such as silicon) or in semiconductor-on-insulator (SOI) substrates.

State of the art FETs can be fabricated by depositing a gate conductor over a gate dielectric and a semiconductor substrate. Generally, the FET fabrication process implements lithography and etching processes to define the gate structures. After providing the gate structures, source/drain extensions are formed into a portion of the semiconductor substrate and on both sides of each gate structure by ion implantation. Sometimes this implant is performed using a spacer to create a specific distance between the gate structure and the implanted junction. In some instances, such as in the manufacture of an n-FET device, the source/drain extensions for the n-FET device are implanted with no spacer. For a p-FET device, the source/drain extensions are typically implanted with a spacer present. A thicker spacer is typically formed after the source/drain extensions have been implanted. In some instances, deep source/drain implants can be performed with the thick spacer present. In other instances, and for advanced technologies, the source region and the drain region can be formed using a selective epitaxial growth process. High temperature anneals can be performed to activate the junctions after which the source/drain and top portion of the gate are generally converted into a metal semiconductor alloy (i.e., a metal silicide). The formation of the metal semiconductor alloy typically requires that a transition metal be deposited on the semiconductor substrate followed by a process to produce the metal semiconductor alloy. Such a process forms metal semiconductor alloy contacts to the deep source/drain regions.

In current technologies, the metal semiconductor alloy contacts that are formed to the source/drain regions typically have a low contact resistance which may degrade the performance of the resulting semiconductor device. As such, there is a need for providing metal semiconductor contact alloys in which the contact resistance thereof is improved.

SUMMARY

Contact openings are formed into a dielectric material exposing a surface portion of a semiconductor substrate. A first transition metal liner including at least one first transition metal element, a second transition metal liner including at least one second transition metal element that is different from the at least one first transition metal element and a metal contact are sequentially formed within each contact opening. Following a planarization process, the structure is annealed forming metal semiconductor alloy contacts at the bottom of each contact opening. Each metal semiconductor alloy contact that is formed includes the at least one first transition metal element, the at least one second transition metal element and a semiconductor element.

In one aspect of the present application, a semiconductor structure including at least one metal semiconductor alloy contact having improved contact resistance is provided. In one embodiment, the semiconductor structure of the present application includes at least one contact opening located in a dielectric material and extending to an uppermost surface of a semiconductor substrate. A first transition metal liner comprising at least one first transition metal element lines at least sidewalls of the at least one contact opening. A second transition metal liner is located on a surface of the first transition metal liner and comprises at least one second transition metal element that is different from the at least one first transition metal element. A metal contact is located on a surface of the second transition metal liner. A metal semiconductor alloy contact is located at a bottom of the opening and forms an interface with a portion of the semiconductor substrate. In accordance with the present application, the metal semiconductor alloy contact comprises the at least one first transition metal element, the at least one second transition metal element and a semiconductor element of the semiconductor substrate.

In another embodiment of the present application, the semiconductor structure includes a semiconductor substrate having a source region and a drain region located within a semiconductor material portion of the semiconductor substrate, wherein the source region and the drain region are spaced apart by a channel region. A functional gate structure is located above the channel region. A dielectric material is located on each side of the functional gate structure. Contact openings are located in the dielectric material and extending to the source region and the drain region. A source-side metal contact structure is located within one of the contact openings, and a drain-side metal contact structure is located within another of the contact openings. Each of the source-side metal contact structure and the drain-side metal contact structure comprises a first transition metal liner comprising at least one first transition metal element lining at least sidewalls of the contact opening, a second transition metal liner located on a surface of the first transition metal liner and comprising at least one second transition metal element that is different from the at least one first transition metal element, a metal contact located on a surface of the second transition metal liner, and a metal semiconductor alloy contact located at a bottom of the opening and forming an interface with a portion of the source region or the drain region. In accordance with the present application, each of the metal semiconductor alloy contacts comprises the at least one first transition metal element, the at least one second transition metal element and a semiconductor element of the semiconductor substrate.

In another aspect of the present application, a method of forming a metal contact structure is provided. The method includes providing a structure including at least one contact opening in a dielectric material that extends to an uppermost surface of a semiconductor substrate. Next, a first transition metal liner comprising at least one first transition metal element, a second transition metal liner comprising at least one second transition metal element that is different from the at least one first transition metal element, and a metal contact are sequentially formed in the at least one contact opening. An annealing is then performed to the structure which forms a metal semiconductor alloy contact at a bottom of the at least one contact opening. In accordance with the present application, the metal semiconductor alloy contact forms an interface with a portion of the semiconductor substrate and comprises the at least one first transition metal element, the at least one second transition metal element and a semiconductor element of the semiconductor substrate.

The above method may be implemented in a gate-first or a gate last processing flow.

DETAILED DESCRIPTION

Figure 1:
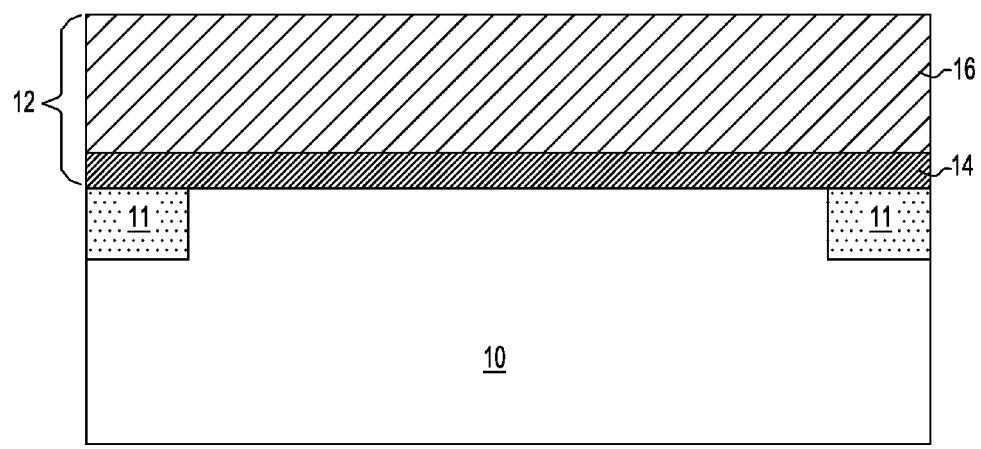
FIG. 1 is a cross sectional view of a first exemplary semiconductor structure including a material stack located on an uppermost surface of semiconductor substrate in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring first to FIG. 1, there is illustrated a first exemplary semiconductor structure including a material stack 12 located on an uppermost surface of semiconductor substrate 10 in accordance with an embodiment of the present application. The material stack 12 includes, from bottom to top, a gate dielectric material 14 and a gate conductor 16.

In some embodiments of the present application, the semiconductor substrate 10 can be a bulk semiconductor substrate. When a bulk semiconductor substrate is employed as semiconductor substrate 10, the bulk semiconductor substrate can be comprised of any semiconductor material including, but not limited to, Si, Ge, SiGe, SiC, SiGeC, and III/V compound semiconductors such as, for example, InAs, GaAs, and InP. Multilayers of these semiconductor materials can also be used as the semiconductor material of the bulk semiconductor. In one embodiment, the semiconductor substrate 10 can be comprised of a single crystalline semiconductor material, such as, for example, single crystalline silicon. In other embodiments, the semiconductor substrate 10 may comprise a polycrystalline or amorphous semiconductor material.

In another embodiment, a semiconductor-on-insulator (SOI) substrate (not specifically shown) can be employed as the semiconductor substrate 10. Although not specifically shown, one skilled in the art understands that an SOI substrate includes a handle substrate, a buried insulator layer located on an upper surface of the handle substrate, and a semiconductor layer located on an uppermost surface of the buried insulator layer. The handle substrate provides mechanical support for the buried insulator layer and the semiconductor layer.

The handle substrate and the semiconductor layer of the SOI substrate may comprise the same, or different, semiconductor material. The term "semiconductor" as used herein in connection with the semiconductor material of the handle substrate and the semiconductor layer denotes any semiconductor material including, for example, Si, Ge, SiGe, SiC, SiGeC, and III/V compound semiconductors such as, for example, InAs, GaAs, or InP. Multilayers of these semiconductor materials can also be used as the semiconductor material of the handle substrate and the semiconductor layer. In one embodiment, the handle substrate and the semiconductor layer are both comprised of silicon. In some embodiments, the handle substrate is a non-semiconductor material including, for example, a dielectric material and/or a conductive material. In yet other embodiments, the handle substrate can be omitted and a substrate including an insulator layer and a semiconductor layer can be used as semiconductor substrate 10.

In some embodiments, the handle substrate and the semiconductor layer may have the same or different crystal orientation. For example, the crystal orientation of the handle substrate and/or the semiconductor layer may be {100}, {110}, or {111}. Other crystallographic orientations besides those specifically mentioned can also be used in the present application. The handle substrate and/or the semiconductor layer of the SOI substrate may be a single crystalline semiconductor material, a polycrystalline material, or an amorphous material. Typically, at least the semiconductor layer is a single crystalline semiconductor material. In some embodiments, the semiconductor layer that is located atop the buried insulator layer can be processed to include semiconductor regions having different crystal orientations.

The buried insulator layer of the SOI substrate may be a crystalline or non-crystalline oxide or nitride. In one embodiment, the buried insulator layer is an oxide such as, for example, silicon dioxide. The buried insulator layer may be continuous or it may be discontinuous. When a discontinuous buried insulator region is present, the insulator region exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer to a layer having a thickness that is more desirable.

In one example, the thickness of the semiconductor layer of the SOI substrate can be from 100 Å to 1000 Å. In another example, the thickness of the semiconductor layer of the SOI substrate can be from 500 Å to 700 Å. In some embodiments, and when an ETSOI (extremely thin semiconductor-on-insulator) substrate is employed, the semiconductor layer of the SOI has a thickness of less than 100 Å. If the thickness of the semiconductor layer is not within one of the above mentioned ranges, a thinning step such as, for example, planarization or etching can be used to reduce the thickness of the semiconductor layer to a value within one of the ranges mentioned above. The buried insulator layer of the SOI substrate typically has a thickness from 10 Å to 2000 Å, with a thickness from 1000 Å to 1500 Å being more typical. The thickness of the handle substrate of the SOI substrate is inconsequential to the present application.

In some other embodiments, hybrid semiconductor substrates which have different surface regions of different crystallographic orientations can be employed as semiconductor substrate 10. When a hybrid substrate is employed, an nFET is typically formed on a (100) crystal surface, while a pFET is typically formed on a (110) crystal plane. The hybrid substrate can be formed by techniques that are well known in the art. See, for example, U.S. Pat. No. 7,329,923, U.S. Publication No. 2005/0116290, dated Jun. 2, 2005 and U.S. Pat. No. 7,023,055, the entire contents of each are incorporated herein by reference.

Semiconductor substrate 10 may be doped, undoped or contain doped and undoped regions therein. For clarity, the doped regions are not specifically shown in the drawings of the present application. Each doped region within the semiconductor material of the semiconductor substrate 10 may have the same, or they may have different conductivities and/or doping concentrations. The doped regions that are present in the semiconductor material of semiconductor substrate 10 are typically referred to as well regions and they are formed utilizing a conventional ion implantation process, gas phase doping or epitaxial growth.

In some embodiments, the semiconductor substrate 10 can be processed to include at least one isolation region 11 therein. The at least one isolation region 11 can be a trench isolation region or a field oxide isolation region. The trench isolation region can be formed utilizing a conventional trench isolation process well known to those skilled in the art. For example, lithography, etching and filling of the trench with a trench dielectric such as an oxide may be used in forming the trench isolation region. Optionally, a liner may be formed in the trench prior to trench fill, a densification step may be performed after the trench fill and a planarization process may follow the trench fill as well. The field oxide isolation region may be formed utilizing a so-called local oxidation of silicon process. Note that the at least one isolation region 11 may provide isolation between neighboring gate structures, typically required when the neighboring gate structures have opposite conductivities, i.e., n-type transistors and p-type transistors. As such, the at least one isolation region 11 can separate a first device region in which an n-type transistor device can be formed and second device region in which a p-type transistor device can be formed.

A material stack 12 is formed on an uppermost surface of the semiconductor substrate 10 and on an uppermost surface of each isolation region 11. As stated above, the material stack 12 includes, from bottom to top, a gate dielectric material 14 and a gate conductor 16. The gate dielectric material 14 and the gate conductor 16 which provide material stack 12 are formed as blanket layers atop the uppermost surface of the semiconductor substrate 10.

In this embodiment of the present application, the material stack 12 is used in providing a functional gate structure. The term "functional gate structure" is used throughout the present application as a permanent gate structure used to control output current (i.e., flow of carriers in the channel) of a semiconducting device through electrical or magnetic fields.

The gate dielectric material 14 that can be used in the present application can be a semiconductor oxide, a semiconductor nitride, and/or a semiconductor oxynitride. In one example, the gate dielectric material 14 can be composed of silicon dioxide, silicon nitride and/or silicon oxynitride. In another embodiment of the present application, the gate dielectric material 14 may include at least a dielectric metal oxide. Exemplary dielectric metal oxides that can be used as gate dielectric material 14 include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a dielectric metal oxide can be formed and used as the gate dielectric material 14.

In some embodiments of the present application, the gate dielectric material 14 can be formed by a deposition technique such as, for example, chemical vapor deposition (CVD), plasma enhanced chemical vapor deposition (PECVD), physical vapor deposition (PVD), sputtering, or atomic layer deposition. In another embodiment of the present application, the gate dielectric material 14 can be formed by a thermal growth technique such as, for example, thermal oxidation and/or thermal nitridation. In yet a further embodiment of the present application, a combination of a deposition and thermal growth may be used in forming a multilayered gate dielectric structure.

In one embodiment of the present application, the gate dielectric material 14 can have a thickness in a range from 1 nm to 10 nm. Other thicknesses that are lesser than or greater than the aforementioned thickness range can also be employed for the gate dielectric material 14.

The gate conductor 16 that can be used in the present application can be composed of doped polysilicon, doped silicon germanium, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), or multilayered combinations thereof. In one embodiment, an entirety of the gate conductor 16 is comprised of a doped polysilicon or doped polysilicon germanium. In another embodiment, a lower portion of the gate conductor 16 is comprised a conductive material other than doped polysilicon or doped polysilicon germanium, and an upper portion of the gate conductor 16 is comprised of doped polysilicon or doped silicon germanium.

The gate conductor 16 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. In one embodiment, the gate conductor 16 has a thickness from 1 nm to 100 nm. Other thicknesses that are lesser than or greater than the aforementioned thickness range can also be employed for the gate conductor 16.

Figure 2:
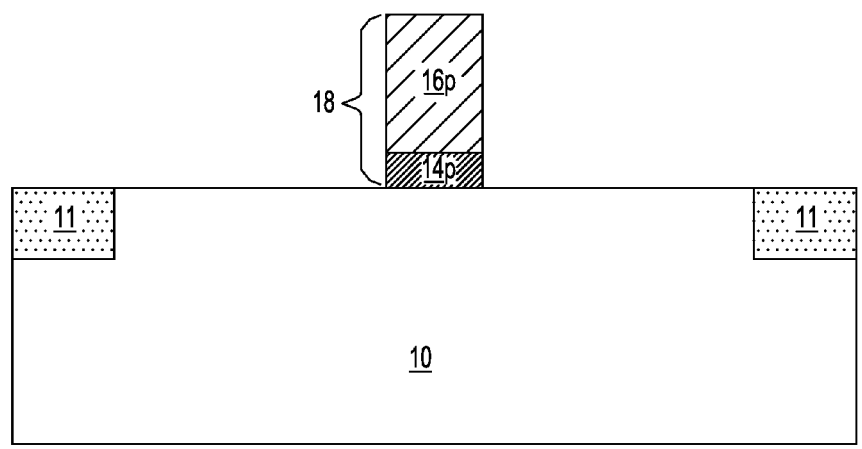
FIG. 2 is a cross sectional view of the first exemplary semiconductor structure of FIG. 1 after patterning the material stack into at least one functional gate structure.

Referring now to FIG. 2, there is illustrated the first exemplary semiconductor structure of FIG. 1 after patterning the material stack 12 (including gate dielectric material 14 and gate conductor 16) into at least one functional gate structure 18. The at least one functional gate structure 18 includes, from bottom to top, a gate dielectric portion 14p and a gate electrode portion 16p. Gate dielectric portion 14p includes a remaining portion of the gate dielectric material 14 of material stack 12, while gate conductor portion 16p includes a remaining portion of the gate conductor 16 of material stack 12. Although the drawing illustrates the formation of a single functional gate structure 18, a plurality of functional gate structures can be formed on a semiconductor surface of semiconductor substrate 10.

The at least one functional gate structure 18 can be formed by lithography and etching. Lithography can include forming a photoresist (not shown) on the topmost surface of gate conductor 16 exposing the photoresist to a desired pattern of radiation, and then developing the exposed photoresist with a resist developer to provide a patterned photoresist atop the gate conductor 16 of material stack 12. At least one etch is then employed which transfers the pattern from the patterned photoresist into the various materials. In one embodiment, the etch used for pattern transfer may include a dry etch process such as, for example, reactive ion etching, plasma etching, ion beam etching or laser ablation. In another embodiment, the etch used for pattern transfer may include a wet chemical etchant such as, for example, KOH (potassium hydroxide). In yet another embodiment, a combination of a dry etch and a wet chemical etch may be used to transfer the pattern. After transferring the pattern into the material layers, the patterned photoresist can be removed utilizing a resist stripping process such as, for example, ashing.

As is shown in the embodiment illustrated in FIG. 2, the sidewall edges of the gate dielectric material portion 14p and the gate conductor portion 16p are vertically coincident to (i.e., vertically aligned with) each other.

Figure 3:
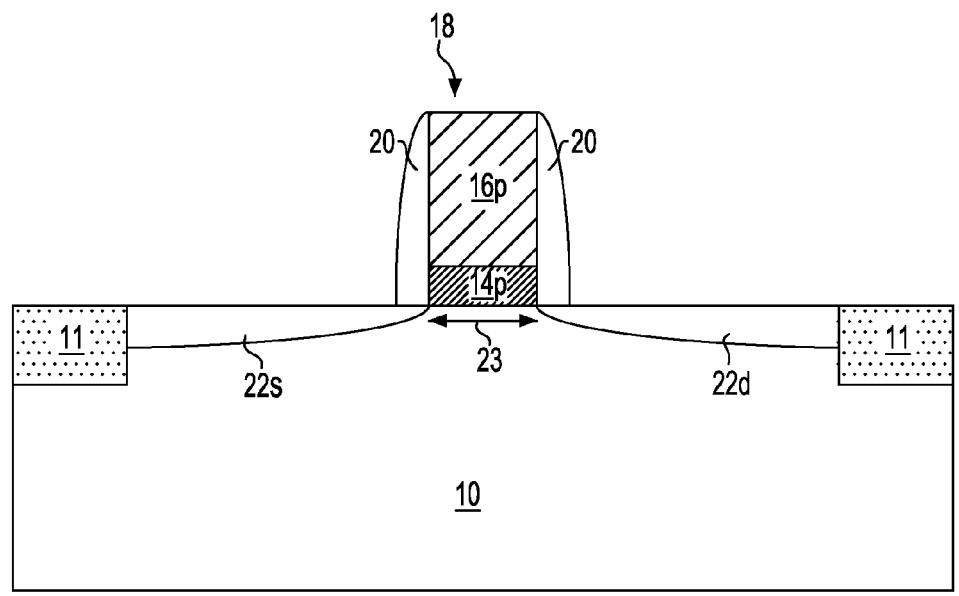
FIG. 3 is a cross sectional view of the first exemplary semiconductor structure of FIG. 2 after forming a spacer on each sidewall of the at least one functional gate structure and forming a source region in a semiconductor material portion of the semiconductor substrate on one side of the at least one functional gate structure and forming a drain region in another semiconductor material portion of the semiconductor substrate on another side of the at least one functional gate structure.

Referring now to FIG. 3, there is illustrated the first exemplary semiconductor structure of FIG. 2 after forming a spacer 20 on each sidewall of the at least one functional gate structure 18 and forming a source region 22s in a semiconductor material portion of the semiconductor substrate 10 on one side of the at least one functional gate structure 18 and forming a drain region 22d in another semiconductor material portion of the semiconductor substrate 10 on another side of the at least one functional gate structure 18. The semiconductor portion of the semiconductor substrate 10 that is located beneath the functional gate structure 18 and positioned between the source region 22s and the drain region 22d is referred as a channel region 23.

The spacer 20 can be formed by first providing a spacer material and then etching the spacer material. The spacer material may be composed of any dielectric spacer material including, for example, a dielectric oxide, dielectric nitride, and/or dielectric oxynitride. In one example, the spacer material used in providing the spacer 20 may be composed of silicon dioxide or silicon nitride. The spacer material can be provided by a deposition process including, for example, chemical vapor deposition (CVD), plasma enhanced chemical vapor deposition (PECVD), or physical vapor deposition (PVD). The etching of the spacer material may comprise a dry etch process such as, for example, a reactive ion etch.

FIG. 3 also shows the presence of a source region 22s located within a semiconductor material portion of the semiconductor substrate 10 on one side of the at least one functional gate structure 18 and a drain region 22d located within another semiconductor material portion of the semiconductor substrate 10 on another side of the at least one functional gate structure 18. In some embodiments, a source extension region and drain extension region (not separately shown) are typically formed prior to forming the spacer 20 utilizing an extension ion implantation process. As such, a portion of each of the source extension region and drain extension region would be located beneath the spacer 20. After forming the spacer 20, source region 22s and drain region 22d are formed utilizing a source/drain ion implantation process. An activation anneal may follow the implantation processes.

The source region 22s (including the corresponding source extension region) and the drain region 22d (including the corresponding drain extension region) may be doped with a p-type or n-type dopant. The term "p-type" refers to the addition of impurities to an intrinsic semiconductor that creates deficiencies of valence electrons. In a silicon-containing substrate, examples of p-type dopants, i.e., impurities, include, but are not limited to, boron, aluminum, gallium and indium. "N-type" refers to the addition of impurities that contributes free electrons to an intrinsic semiconductor. In a silicon containing substrate examples of n-type dopants, i.e., impurities, include, but are not limited to, antimony, arsenic and phosphorous. The concentration of dopants within the source region 22s (and corresponding source extension region) and the drain region 22d (and the corresponding drain extension region) can be within ranges typically used in forming metal oxide semiconductor field effect transistors (MOSFETs).

Figure 4:
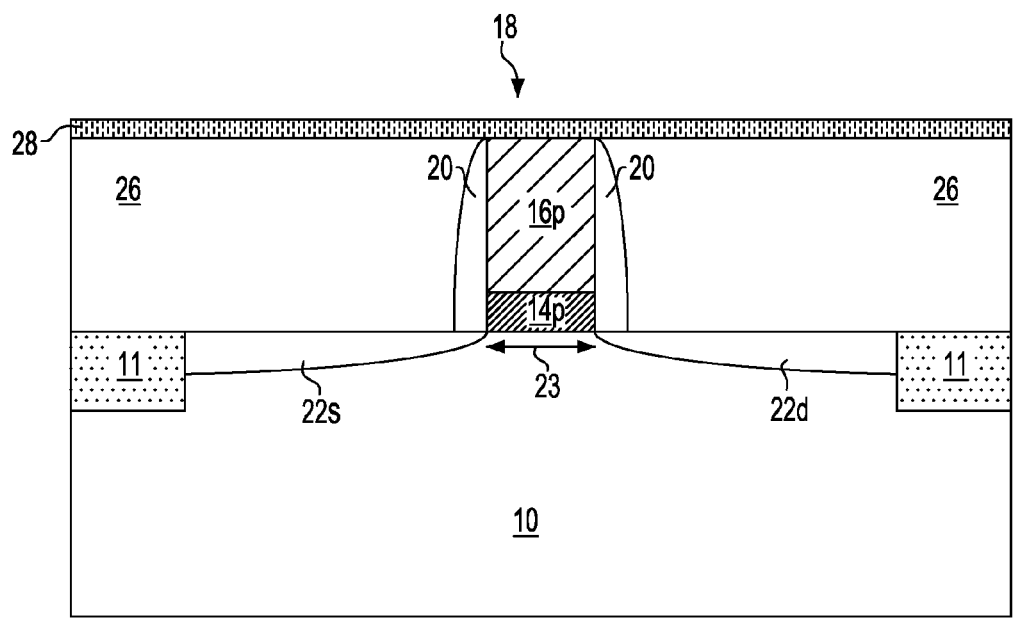
FIG. 4 is a cross sectional view of the first exemplary semiconductor structure of FIG. 3 after forming a dielectric material and thereafter a dielectric cap material.

Referring now to FIG. 4, there is illustrated the first exemplary semiconductor structure of FIG. 3 after forming a dielectric material 26 and thereafter a dielectric cap material 28. As is illustrated, the dielectric material 26 has an uppermost surface that is coplanar with an uppermost surface of the at least one functional gate structure 18, The dielectric cap material has a bottommost surface that contacts each of an uppermost surface of the source region 24s, an uppermost surface of the drain region 24d, and an uppermost surface of each insulation region 11. The uppermost surface of the at least one functional gate structure 18 is exposed immediately after forming the dielectric material 26.

In some embodiments, the dielectric material 26 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the dielectric material 26. The use of a self-planarizing dielectric material as dielectric material 26 may avoid the need to perform a subsequent planarizing step.

In one embodiment, the dielectric material 26 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as dielectric material 26, a planarization process or an etch back process follows the deposition of the dielectric material. The thickness of the dielectric material 26 that can be employed in the present application may vary depending on the type of dielectric material employed as well as the method that was employed in forming the same. In one embodiment, the dielectric material 26 has a thickness from 80 nm to 500 nm. Other thicknesses that are greater or lesser than the range provided above can also be used for the dielectric material 26.

After forming dielectric material 26, a dielectric cap material 28 is formed on an uppermost surface of the dielectric material 26 as well as an uppermost surface of the at least one functional gate structure 18. The dielectric cap material 28 includes an insulator material that differs from the dielectric material 26. Examples of insulator materials that can be used as the dielectric cap material 28 include, for example, silicon dioxide, silicon nitride and silicon oxynitride. The dielectric cap material 28 can be formed by a deposition process including, for example, chemical vapor deposition, plasma enhanced chemical vapor deposition, evaporation and spin-on coating. The dielectric cap material 28 has a thickness from 1 nm to 20 nm. Other thicknesses can also be used for the thickness of the dielectric cap material 28.

Figure 5:
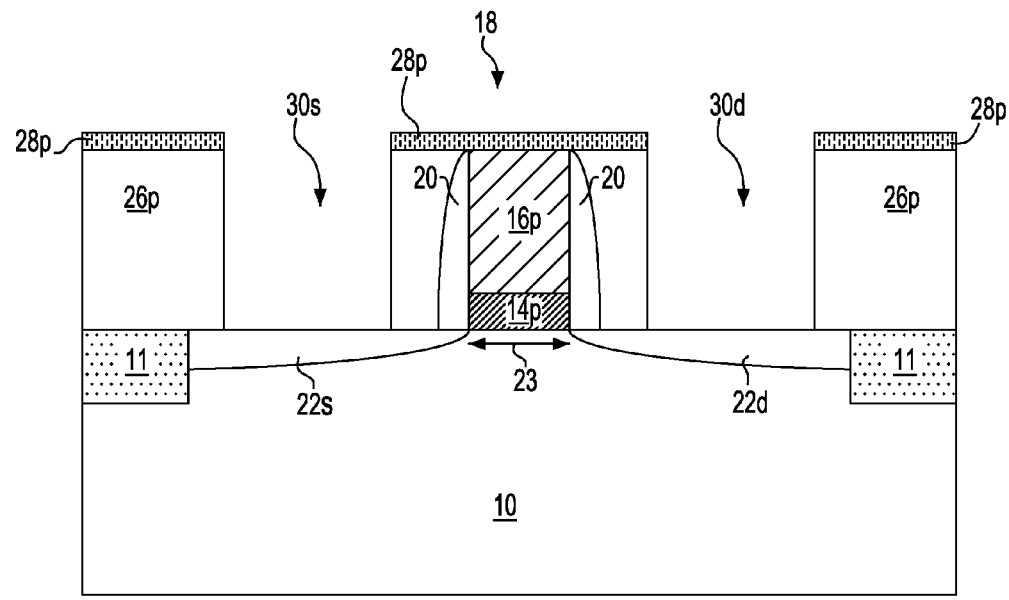
FIG. 5 is a cross sectional view of the first exemplary semiconductor structure of FIG. 4 after forming a plurality of contact openings through the dielectric cap material and the dielectric material to expose the source region and the drain region of the at least one functional gate structure.

Referring now to FIG. 5, there is illustrated the first exemplary semiconductor structure of FIG. 4 after forming a plurality of contact openings through the dielectric cap material 28 and the dielectric material 26 to expose the source region 22s and the drain region 22d of the at least one functional gate structure 18. Notably, contact opening 30s exposes the source region 22s, while contact opening 30d exposes the drain region 22d. The remaining portions of the dielectric material 26 may be referred to herein as dielectric material portions 26p and the remaining portions of the dielectric cap material 28 may be referred to herein as dielectric cap material portions 28p.

The plurality of openings 30s, 30d can be formed by lithography and etching. One or more etching processes can be used in forming the plurality of openings 30s, 30d. As is shown, a dielectric cap material portion is present on a topmost surface of the at least one functional gate structure 18, and other remaining portions of the dielectric cap material are located on remaining portions of the dielectric material 26. As is shown in the drawings of the present application, the dielectric cap material portion 28p that is located on the topmost surface of each functional gate structure 18 extends beyond the edges of the functional gate structure 18 and beyond an outermost edge of each spacer 20. Also, a portion of each dielectric cap material portion 28p that is present on the topmost surface of the functional gate structure 18 is present on a dielectric material portion 26p that remains adjacent to the spacer 20. Further, the dielectric cap material portion 28p and the dielectric material portion 26p that are present above the isolation region 11 extend beyond the outer most edges of the isolation region 11.

In some embodiments of the present application, the plurality of openings 30s, 30d have a width, as measured from one exposed sidewall of a dielectric material portion 26p to another exposed sidewall of another dielectric material portion 26p, of from 10 nm to 50 nm. Other widths that are greater than or lesser than the aforementioned widths can also be used in the present application.

Figure 6:
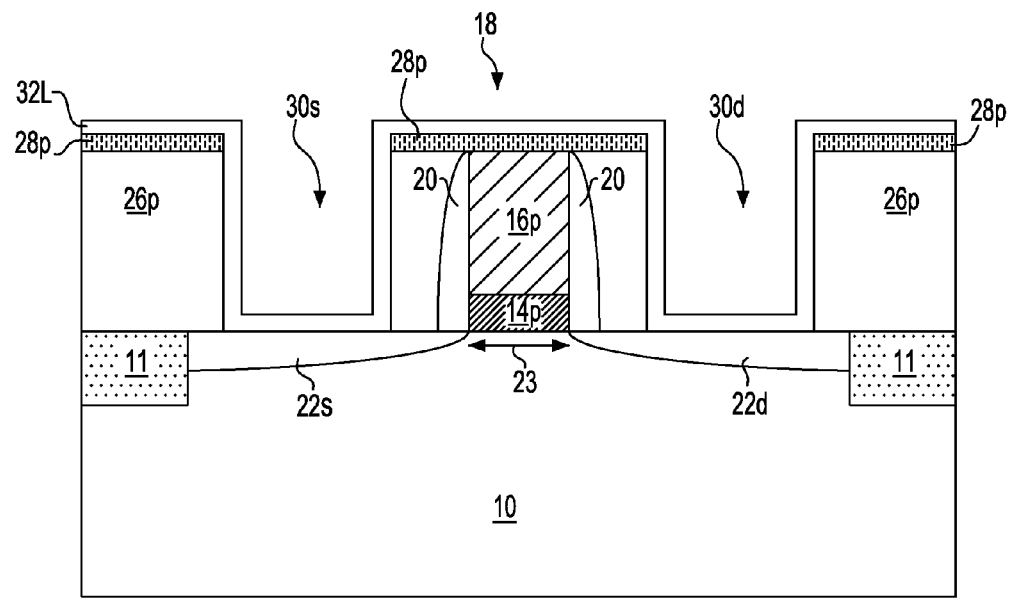
FIG. 6 is a cross sectional view of the first exemplary semiconductor structure of FIG. 5 after forming a first transition metal liner on an uppermost surface of the dielectric cap material and within each contact opening.

Referring now to FIG. 6, there is illustrated the first exemplary semiconductor structure of FIG. 5 after forming a first transition metal liner 32L on an uppermost surface of each dielectric cap material portion 28p and within each contact opening 30s, 30d. Within each contact opening, a bottommost surface of the first transition metal line 32L contacts a sidewall of each dielectric material portion 26p, a sidewall of each dielectric cap material portion 28p and exposed surface of the source region 22s or drain region 22d.

The first transition metal liner 32L that is formed in the present application is a contiguous layer and has an as deposited thickness of from 1 nm to 10 nm. The thickness of the first transition metal liner 32L may be lesser than or greater than the range mentioned herein.

The first transition metal liner 32L comprises at least one first transition metal element which can be converted into a metal semiconductor alloy or which can aide in silicide or germanide diffusion. In one embodiment of the present application, the first transition metal liner 32L comprises at least one first transition metal selected from Groups 4-10 of the Periodic Table of Elements (throughout the present application the IUPAC nomenclature is used). Exemplary first transition metals that can be used include titanium (Ti), zirconium (Zr), hafnium (Hf), tantalum (Ta), tungsten (W), nobium (Nb), molybdenum (Mo), vanadium (V), rhenium (Re), chromium (Cr), cobalt (Co), nickel (Ni), palladium (Pd) and platinum (Pt). In one embodiment, the first transition metal liner 32L may comprise Ti, Hf or W; these metals are exemplary metals that can be converted into a metal semiconductor alloy. In another embodiment, the first transition metal liner 32L may comprise a NiPt alloy; this alloy represents a type of metal that can aide in silicide or germanide diffusion.

The first transition metal liner 32L can be formed by a deposition process including, for example, chemical vapor deposition, plasma enhanced chemical vapor deposition, plating or sputtering. In some embodiments, the first transition metal liner 32L can be formed utilizing a co-deposition process.

Figure 7:
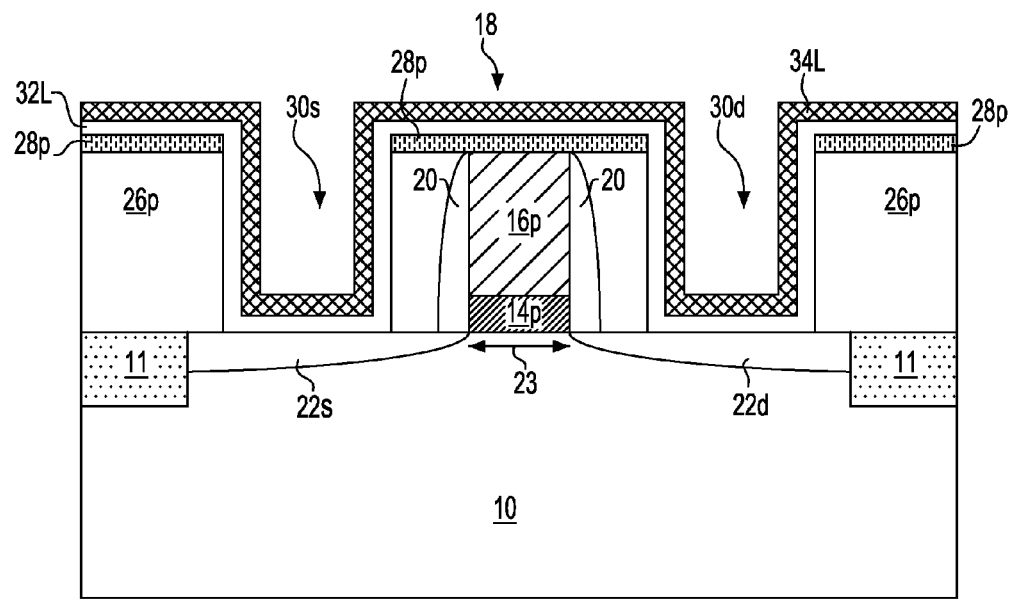
FIG. 7 is a cross sectional view of the first exemplary semiconductor structure of FIG. 6 after forming a second transition metal liner on an uppermost surface of the first transition metal liner.

Referring now to FIG. 7, there is illustrated the first exemplary semiconductor structure of FIG. 6 after forming a second transition metal liner 34L on an uppermost surface first transition metal liner 32L. The second transition metal liner 34L is a contiguous layer that is present on the uppermost surface of the first transition metal liner 32L. In accordance with the present application, the second transition metal liner 34L comprises at least one second transition metal element that is (are) different from the at least one first transition metal element that provides the first transition metal liner 32L. The second transition metal liner 34L that is formed has an as deposited thickness of from 1 nm to 10 nm. The thickness of the second transition metal liner 34L may be lesser than or greater than the range mentioned herein.

The second transition metal liner 34L comprises at least one second transition metal element which differs from the at least one first transition metal element. Moreover, the second transition metal liner 34L includes at least one second transition metal element that can diffuse through the first metal liner 34L and which can be converted into a metal semiconductor alloy. In one embodiment of the present application, the second transition metal liner 34L comprises at least one second transition metal selected from Groups 4-10 of the Periodic Table of Elements. Exemplary second transition metals that can be used include titanium (Ti), zirconium (Zr), hafnium (Hf), tantalum (Ta), tungsten (W), nobium (Nb), molybdenum (Mo), vanadium (V), rhenium (Re), chromium (Cr), cobalt (Co), nickel (Ni), palladium (Pd) and platinum (Pt). In one embodiment, and when the first transition metal liner 32L comprise Ti, Hf or W, the second transition metal liner 34L may comprise a NiPt alloy. In another embodiment, and when the first transition metal liner 32L comprised a NiPt alloy, the second transition metal liner 34L may comprise Ti, Hf or W.

The second transition metal liner 34L can be formed by a deposition process including, for example, chemical vapor deposition, plasma enhanced chemical vapor deposition, plating or sputtering. In some embodiments, the second transition metal liner 34L can be formed utilizing a co-deposition process.

Figure 8:
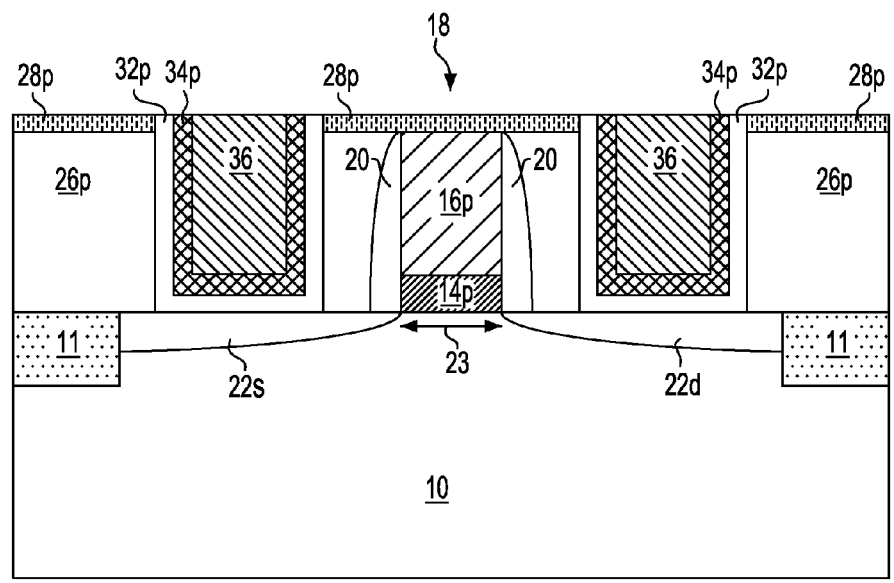
FIG. 8 is a cross sectional view of the first exemplary semiconductor structure of FIG. 7 after filling remaining portions of each contact opening with a contact metal and performing a planarization process.

Referring now to FIG. 8, there is illustrated the first exemplary semiconductor structure of FIG. 7 after filling remaining portions of each contact opening 30s, 30d with a contact metal and performing a planarization process.

The contact metal includes a conductive material that differs from either the at least one first transition metal that provides the first transition metal liner 32L and the at least one second transition metal that provides the second transition metal liner 34L. Exemplary contact metals that can be used in the present application include at least one of copper, tungsten, and aluminum. In one embodiment, the contact metal that fills each contact opening 30s, 30d comprises copper or a copper alloy such as, for example, a copper-aluminum alloy. The conductive material used in providing the contact metal may be formed by a deposition process including chemical vapor deposition (CVD), plasma enhanced chemical vapor deposition (PECVD), sputtering, or chemical solution deposition. Alternatively, a plating process that fills each contact opening 30s, 30d from the bottom upwards can be used.

After depositing the conductive material used in providing the metal contact, a planarization process such as, for example, chemical mechanical polishing (CMP) and/or grinding, can be employed to remove portions of the conductive metal, the second transition metal liner 34L and the first transition metal liner 32L that extends outside and above the mouth of each contact opening 30s, 30d. In some embodiments, the planarization step can stop on an uppermost surface of each dielectric cap material portion 28p. In another embodiment, the planarization step can remove each dielectric cap material portion 28p from the structure. The portions of the second transition metal liner 34L and the first transition metal liner 32L that remain after the planarization process are referred to herein as a second transition metal portion 34p and the first transition metal portion 32p, respectively. The remaining portion of the contact metal is labeled as element 36 in the drawing of the present application. As is shown, and after planarization, and uppermost surface of the contact metal 36 is coplanar with an uppermost surface of both the first and second transition metal portions 32p, 34p.

Figure 9:
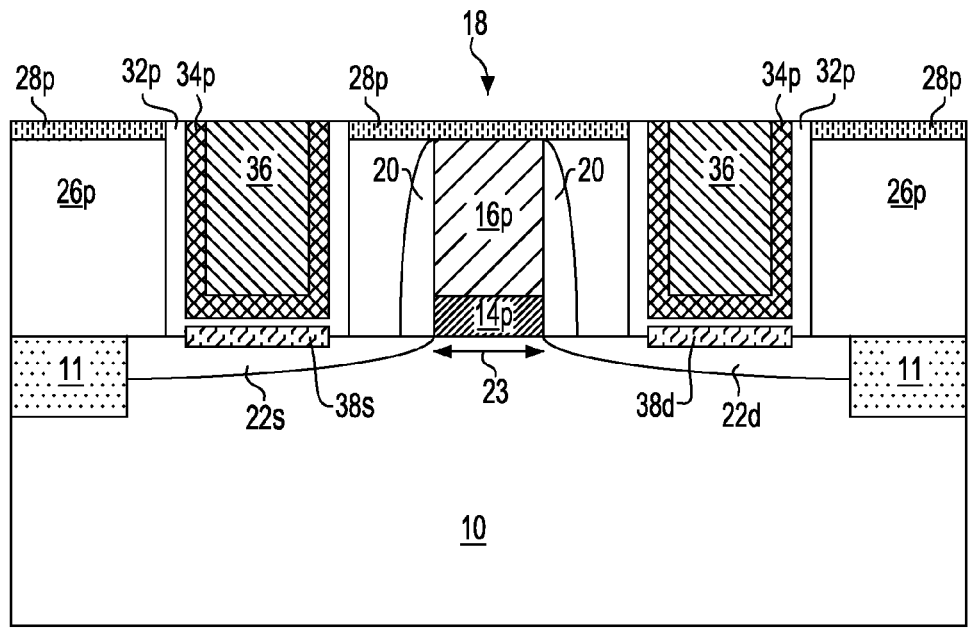
FIG. 9 is a cross sectional view of first exemplary semiconductor structure of FIG. 8 after performing an anneal process in which a source-side metal semiconductor alloy contact comprising the at least one first transition metal element, the at least one second transition metal element and a semiconductor element is formed at the bottom of one of the contact openings and on one side of the at least one functional gate structure, and a drain-side metal semiconductor alloy contact comprising the at least one first transition metal element, the at least one second transition metal element and a semiconductor element is formed at the bottom of another of the contact openings and on another side of the at least one functional gate structure.

Referring now to FIG. 9, there is illustrated the first exemplary semiconductor structure of FIG. 8 after performing an anneal process in which a source-side metal semiconductor alloy contact 38s is formed at the bottom of one of the contact openings 30s and on one side of the at least one functional gate structure 18, and a drain-side metal semiconductor alloy contact 38*d* is formed at the bottom of another of the contact openings 30*d* and on another side of the at least one functional gate structure 18.

The source-side metal semiconductor alloy contact 38*s* and the drain-side metal semiconductor alloy contact 38*d* each comprise the at least one first transition metal element of the first transition metal liner 32L, the at least one second transition metal element of the second transition metal liner 34L and a semiconductor element from the semiconductor substrate 10. In one embodiment, and when the semiconductor substrate 10 comprises silicon, the source-side metal semiconductor alloy contact 38*s* and the drain-side metal semiconductor alloy contact 38*d* each comprise a silicide comprising the at least one first transition metal element of the first transition metal liner 32L, and the at least one second transition metal element of the second transition metal liner 34L. In one example, and when the semiconductor substrate 10 comprises silicon, the source-side metal semiconductor alloy contact 38*s* and the drain-side metal semiconductor alloy contact 38*d* each comprise a silicide of Ni, Pt and Ti. In another embodiment, and when the semiconductor substrate 10 comprises germanium, the source-side metal semiconductor alloy contact 38*s* and the drain-side metal semiconductor alloy contact 38*d* each comprise a germide comprising the at least one first transition metal element of the first transition metal liner 32L, and the at least one second transition metal element of the second transition metal liner 34L. In one example, and when the semiconductor substrate 10 comprises germanium, the source-side metal semiconductor alloy contact 38*s* and the drain-side metal semiconductor alloy contact 38*d* each comprise a germanide of Ni, Pt and Ti.

As is shown, the source-side metal semiconductor alloy contact 38*s* and the drain-side metal semiconductor alloy contact 38*d* are located at the bottom of each contact opening 30*s*, 30*d* and a portion of each extends into the corresponding source/drain regions. The source-side metal semiconductor alloy contact 38*s* and the drain-side metal semiconductor alloy contact 38*d* each have an uppermost surface that is located above the uppermost surface of the semiconductor substrate 10, and a bottommost surface that is located beneath the uppermost surface of the semiconductor substrate 10. Furthermore, each of the source-side and the drain-side metal semiconductor alloy contacts 38*s*, 38*d* is embedded within a remaining portion of the first transition metal liner 32*p*.

In one embodiment of the present application, a laser anneal is used to form the structure shown in FIG. 9. In one embodiment, the laser anneal may be performed at a temperature from 800° C. to 1100° C. for a time period, i.e., duration, of from 0.2 milliseconds to 1 millisecond. In one embodiment, the laser anneal can utilize a laser having an energy from 500 watts to 2000 watts. In another embodiment, the laser anneal can be performed utilizing a raster scan beam size of from 1 cm long to 100 microns wide. In one example, the laser anneal can be performed utilizing a 10.6 micron $CO_2$ laser. In order to promote the efficiency of the $CO_2$ laser coupling with the semiconductor substrate, a laser with a shorter wavelength (e.g., InGaAs laser at 880 nm) can be used in conjunction with the $CO_2$ laser.

During the annealing process, the at least one first transition metal from the first transition metal liner 32L, and the at least one second transition metal from the second transition metal liner 34L diffusion into the semiconductor material portions of the source region 22*s* and the drain region 22*d* forming the metal semiconductor alloy contact 38*s*, 38*d* described above. The source-side metal semiconductor alloy contact 38*s* and the drain-side metal semiconductor alloy contact 38*d* each have a thickness from 2 nm to 20 nm. Thinning of a horizontal portion of the first transition metal liner 32L may occur as shown in FIG. 9.

FIG. 9 illustrates one semiconductor structure that can be formed in the present application. The semiconductor structure shown in FIG. 9 includes a semiconductor substrate 10 having a source region 22*s* and a drain region 22*d* located within a semiconductor material portion of the semiconductor substrate 10, wherein the source region 22*s* and the drain region 22*d* are spaced apart by a channel region 23. A functional gate structure 18 is located above the channel region 23. A dielectric material 26 or 26*p* is located on each side of the functional gate structure 18. A contact opening 30*s*, 30*d* is located in each dielectric material 26 or 26*p* and extending to the source region 22*s* or the drain region 22*d*. A source-side metal contact structure (32*p*, 34*p*, 36 and 38*s*) is located within one of the contact openings 30*s*, and a drain-side metal contact structure (32*p*, 34*p*, 36 and 38*d*) is located within another of the contact openings 30*d*. Each of the source-side metal contact structure and the drain-side metal contact structure comprises a first transition metal liner 32*p* comprising at least one first transition metal element lining at least the sidewalls of the contact opening 30*s*, 30*d*, a second transition metal liner 34*p* located on a surface of the first transition metal liner 32*p* and comprising at least one second transition metal element that is different from the at least one first transition metal element, a metal contact 36 located on a surface of the second transition metal liner 34*p*, and a metal semiconductor alloy contact 38*s*, 38*d* located at a bottom of the opening 30*s*, 30*d* and forming an interface with a portion of the source region 22*s* or the drain region 22*d*. In accordance with the present application, each of the metal semiconductor alloy contacts 28*s*, 38*d* comprises the at least one first transition metal element, the at least one second transition metal element and a semiconductor element of the semiconductor substrate 10.

Figure 10:
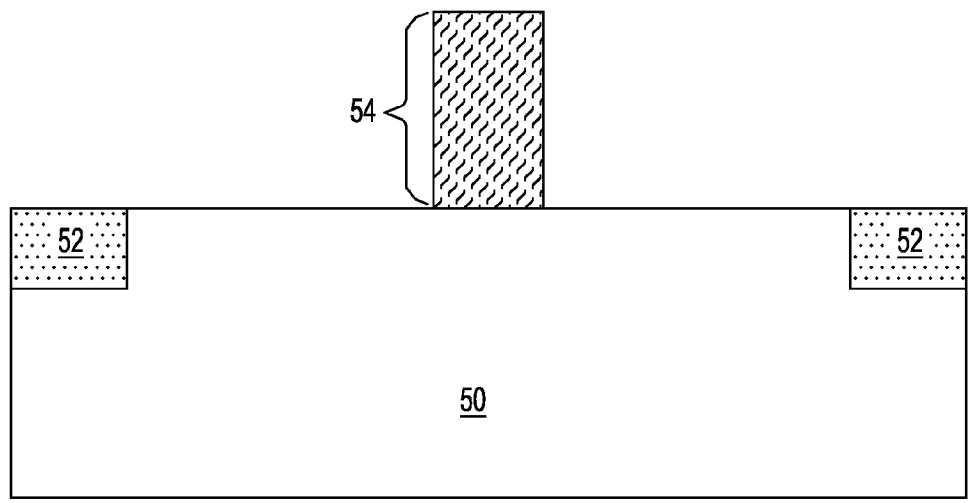
FIG. 10 is a cross sectional view of a second exemplary semiconductor structure including at least one sacrificial gate structure formed on an uppermost surface of a semiconductor substrate in accordance with another embodiment of the present application.

Referring now to FIG. 10, there is illustrated a second exemplary semiconductor structure including at least one sacrificial gate structure 54 formed on an uppermost surface of a semiconductor substrate 50 in accordance with another embodiment of the present application. The semiconductor substrate 50 used in providing the second exemplary semiconductor structure shown in FIG. 10 is the same as semiconductor substrate 10 used in providing the first exemplary semiconductor structure shown in FIG. 1. Semiconductor substrate 50 may also be processed to include an isolation region 52. Isolation region 52 can be formed and include materials as described above in forming isolation regions 11 within semiconductor substrate 10.

The at least one sacrificial gate structure 54 is formed on an uppermost surface of semiconductor substrate 50. The term "sacrificial gate structure" is used throughout the present application to denote a material that serves as a placeholder structure for a functional gate structure to be subsequently formed. The at least one sacrificial gate structure 54 can be formed by first providing a blanket layer of a sacrificial gate material on an uppermost surface of the semiconductor substrate 50. The blanket layer of sacrificial gate material can be formed, for example, by chemical vapor deposition or plasma enhanced chemical vapor deposition. The thickness of the blanket layer of sacrificial gate material can be from 50 nm to 300 nm, although lesser and greater thicknesses can also be employed. The blanket layer of sacrificial gate material can include any material that can be selectively removed from the structure during a subsequently performed etching process. In one embodiment, the blanket layer of sacrificial gate material may be composed of polysilicon. In another embodiment of the present application, the blanket layer of sacrificial gate material may be composed of a metal such as, for example, Al, W, or Cu. After providing the blanket layer of sacrificial gate material, the blanket layer of sacrificial gate material can be patterned by lithography and etching so as to form the at least one sacrificial gate structure 54.

Figure 11:
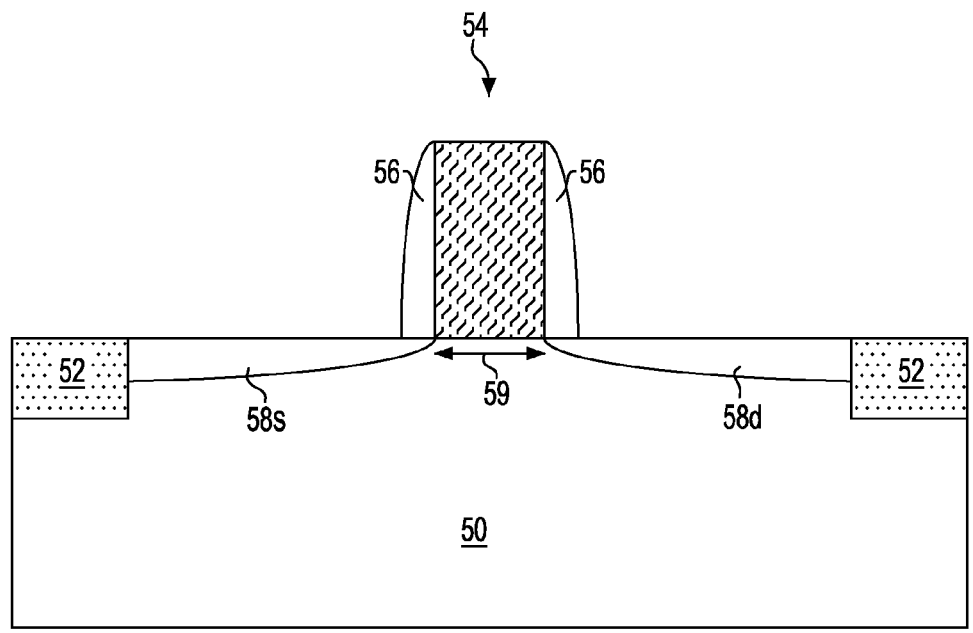
FIG. 11 is a cross sectional view of the second exemplary semiconductor structure of FIG. 10 after forming a spacer on each sidewall of the at least one sacrificial gate structure and forming a source region on one side of the at least one sacrificial gate structure and a drain region on another side of the at least one sacrificial gate structure.

Referring now to FIG. 11, there is illustrated the second exemplary semiconductor structure of FIG. 10 after forming a spacer 56 on each sidewall of the at least one sacrificial gate structure 54 and forming a source region 58s on one side of the at least one sacrificial gate structure 54 and a drain region 58d on another side of the at least one sacrificial gate structure 54. The semiconductor portion of the semiconductor substrate 50 that is positioned between the source region 58s and the drain region 58d is referred as a channel region 59.

The spacer 56 comprises one of the spacer materials mentioned above in forming spacer 20 to the first exemplary semiconductor structure. Spacer 56 can also be formed utilizing the technique mentioned above in forming spacer 20. The source region 58s and the drain region 58d can be formed by ion implantation as was also mentioned above in forming the source region 22s and the drain region 22d in the first exemplary semiconductor structure.

Figure 12:
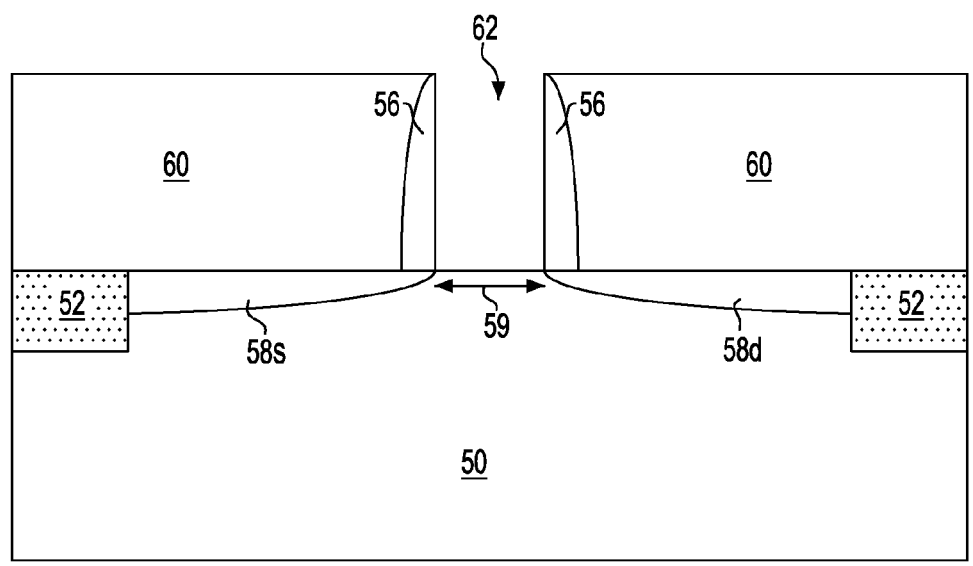
FIG. 12 is a cross sectional view of the second exemplary semiconductor structure of FIG. 11 after forming a dielectric material and thereafter forming a gate cavity by removing the at least one sacrificial gate structure.

Referring now to FIG. 12, there is illustrated the second exemplary semiconductor structure of FIG. 11 after forming a dielectric material 60 and thereafter forming a gate cavity 62 by removing the at least one sacrificial gate structure 54. Prior to forming the gate cavity, the dielectric material 60 has an uppermost surface that is coplanar with an uppermost surface of the at least one sacrificial gate structure 54. As such, the uppermost surface of the at least one sacrificial gate structure 54 is exposed after forming the dielectric material 60.

The dielectric material 60 that is used in this embodiment of the present application may include one of the dielectric materials mentioned above for dielectric material 26. Also, dielectric material 60 may be formed utilizing one of the techniques mentioned above in forming dielectric material 26. The dielectric material 60 may have a thickness within the range mentioned above for dielectric material 26.

Each gate cavity 62 can be formed by removing each of the sacrificial gate material structures 54 from the structure. Each sacrificial gate material structure 54 can be removed by etching. In one example, a reactive ion etch can be used to removal each sacrificial gate material structure 54.

Figure 13:
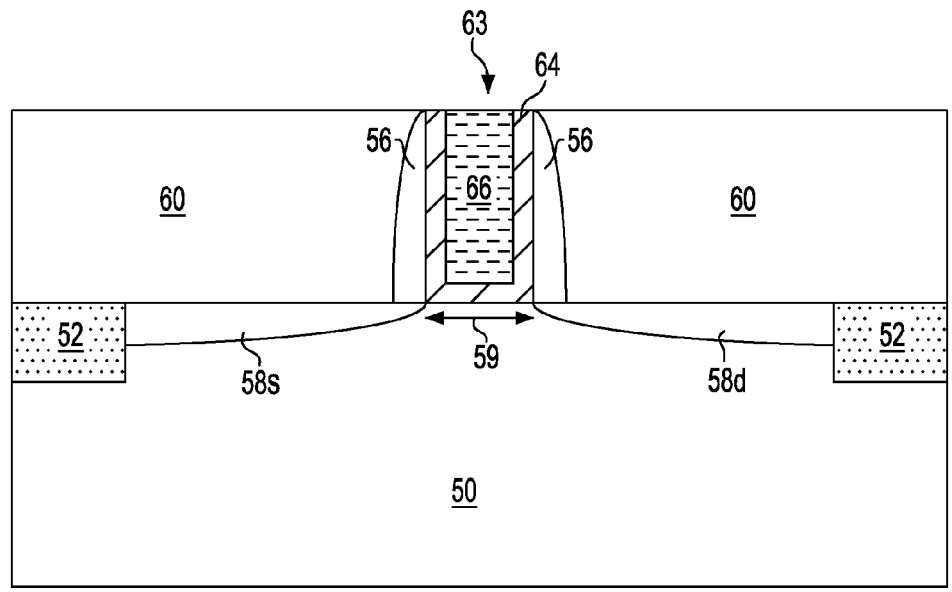
FIG. 13 is a cross sectional view of the second exemplary semiconductor structure of FIG. 12 after forming a gate dielectric portion and a gate conductor portion within the gate cavity.

Referring now to FIG. 13, there is illustrated the second exemplary semiconductor structure of FIG. 12 after forming a gate dielectric portion 64 and a gate conductor portion 66 within the gate cavity 62. The gate dielectric portion 64 and the gate conductor portion 66 provide a functional gate structure 63 within the area previously occupied by the sacrificial gate structure 54.

In some embodiments and as shown in the drawing, the gate dielectric portion 64 is U-shaped having a bottommost portion in direct contact with an uppermost surface of the semiconductor substrate 50 and vertical portions that are located on exposed sidewalls of each spacer 56. Within each gate cavity 62, the gate dielectric portion 64 surrounds the gate conductor portion 64. In another embodiment, the gate dielectric portion 64 is not U-shaped and thus lacks the vertical portions mentioned. In such an embodiment, the gate conductor portion 66 that is formed atop the non-U-shaped gate dielectric fills the remaining portion of the gate cavity and has outermost edges that directly contact a sidewall surface of each spacer 56.

The gate dielectric portion 64 may comprise one of the gate dielectric materials mentioned above for gate dielectric material 14. Also, the gate dielectric portion 64 may be formed utilizing one of the deposition techniques or thermal growth techniques mentioned above in forming gate dielectric 14. The thickness of gate dielectric portion 64 is also with the range mentioned above for gate dielectric material 14.

The gate conductor portion 66 may comprise one of the metal gate conductor materials mentioned above for gate conductor 16. Also, the gate dielectric portion 66 may be formed utilizing one of the deposition techniques mentioned above in forming gate conductor 16. The thickness of gate dielectric portion 66 is also with the range mentioned above for gate conductor 16.

Figure 14:
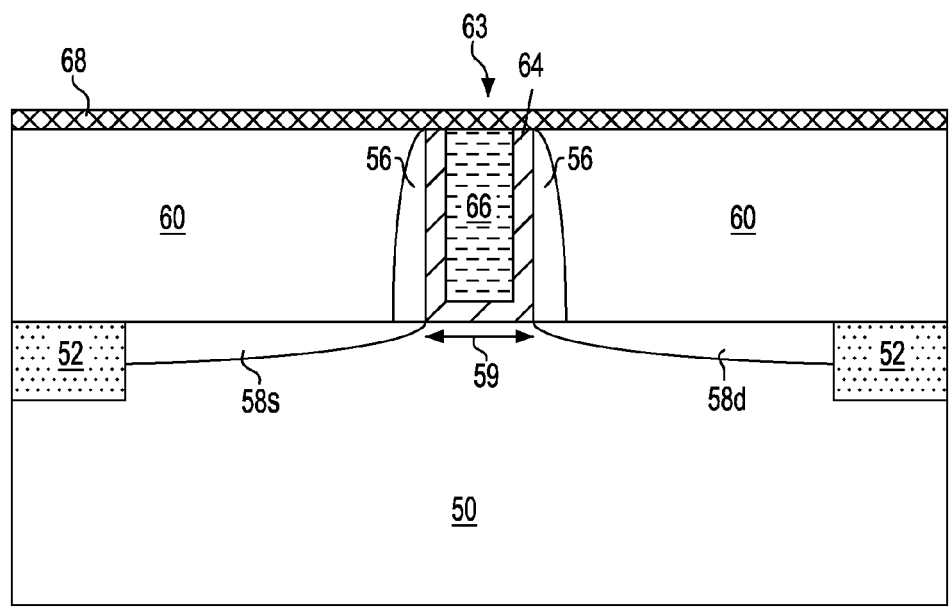
FIG. 14 is a cross sectional view of the second exemplary semiconductor structure of FIG. 13 after forming a dielectric cap material on an uppermost surface of the dielectric material.

Referring now to FIG. 14, there is illustrated the second exemplary semiconductor structure of FIG. 13 after forming a dielectric cap material 68 on an uppermost surface of the dielectric material 60. The dielectric cap material 68 includes one of the insulator materials mentioned above for dielectric cap material 28. The dielectric cap material 68 can be formed utilizing one of the techniques mentioned above in forming dielectric cap material 28. Also, the dielectric cap material 68 used in this embodiment of the present application can have a thickness within the range mentioned above for dielectric cap material 28.

Figure 15:
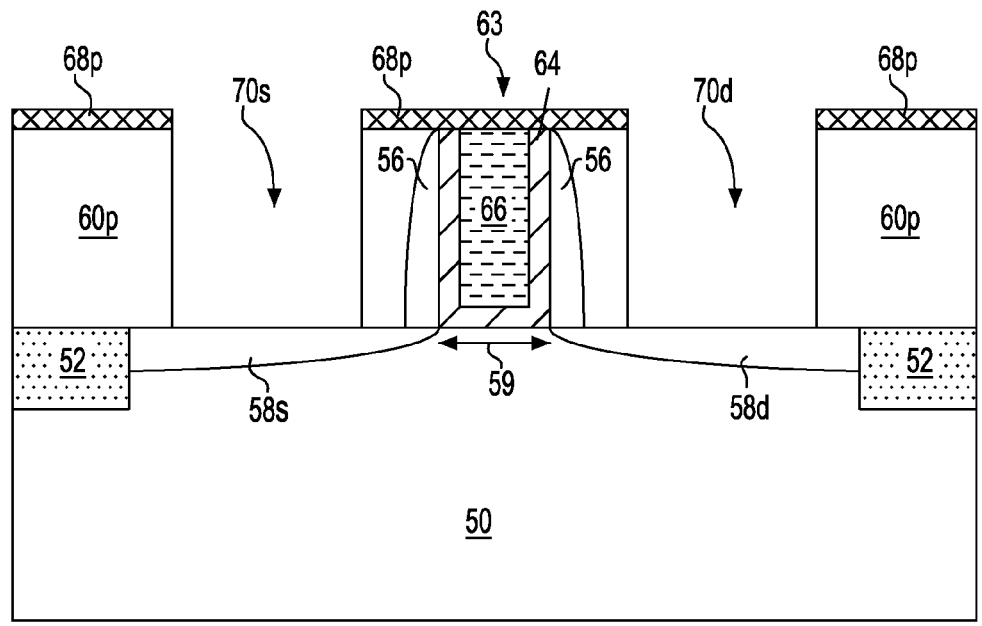
FIG. 15 is a cross sectional view of the second exemplary semiconductor structure of FIG. 14 after forming a plurality of contact openings through the dielectric cap material and the dielectric material exposing the source region and the drain region.

Referring now to FIG. 15, there is illustrated the second exemplary semiconductor structure of FIG. 14 after forming a plurality of openings 70s, 70d through the dielectric cap material 68 and the dielectric material 60 exposing the source region 58s and the drain region 58d. Each remaining portion of the dielectric cap material 68 is referred to herein as dielectric cap material portion 68p, while each remaining portion of the dielectric material 60 can be referred to herein as dielectric material portion 60p. The plurality of openings 70s, 70d can be formed by lithography and etching. One or more etching processes can be used in forming the plurality of openings 70s, 70d. A remaining portion of the dielectric cap material portion 68p is present on a topmost surface of each functional gate structure 63. As is shown in the drawings of the present application, the dielectric cap material portion 68p that is located on the topmost surface of each functional gate structure 63 extends beyond the edges of the functional gate structure 63 and beyond an outermost edge of each spacer 56. Also, a portion of each dielectric cap material portion 68p that is present on the topmost surface of the functional gate structure 63 is present on a dielectric material portion 60p that remains adjacent to the spacer 56. Further, the dielectric cap material portion 68p and the dielectric material portion 60p that is present above the isolation regions 52 extend beyond the outer most edges of the isolation regions 52.

Figure 16:
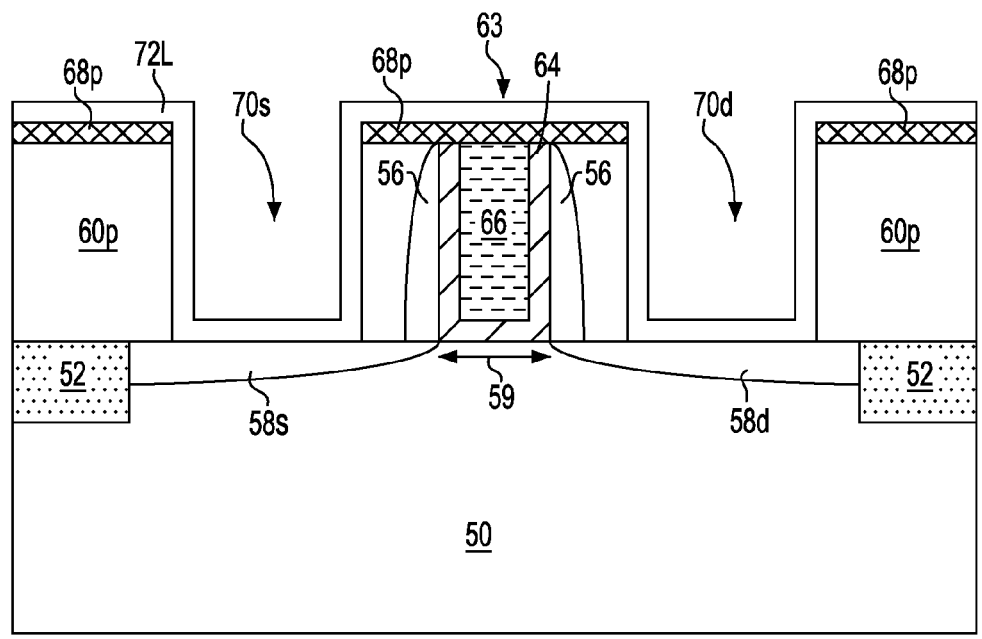
FIG. 16 is a cross sectional view of the secondary exemplary semiconductor structure of FIG. 15 after forming a first transition metal liner on an uppermost surface of the dielectric cap material and within each contact opening.

Referring now FIG. 16, there is cross sectional view of the second exemplary semiconductor structure of FIG. 15 after forming a first transition metal liner 72L on an uppermost surface of the dielectric cap material portion 68p and within each contact opening 70s, 70d. The first transition metal liner 72L is a contiguous layer. The first transition metal liner 72L that is employed in this embodiment of the present application is the same as the first transition metal liner 32L described above. Notably, the first transition metal liner 72L comprises at least one first transition metal element as previously described above. The first transition metal liner 72L of this embodiment of the present application can be formed utilizing one of the techniques mentioned above in forming the first transition metal liner 32L. The thickness of the first transition metal liner 72L employed in this embodiment of the present disclosure is within the thickness range mentioned above for first transition metal liner 32L.

Figure 17:
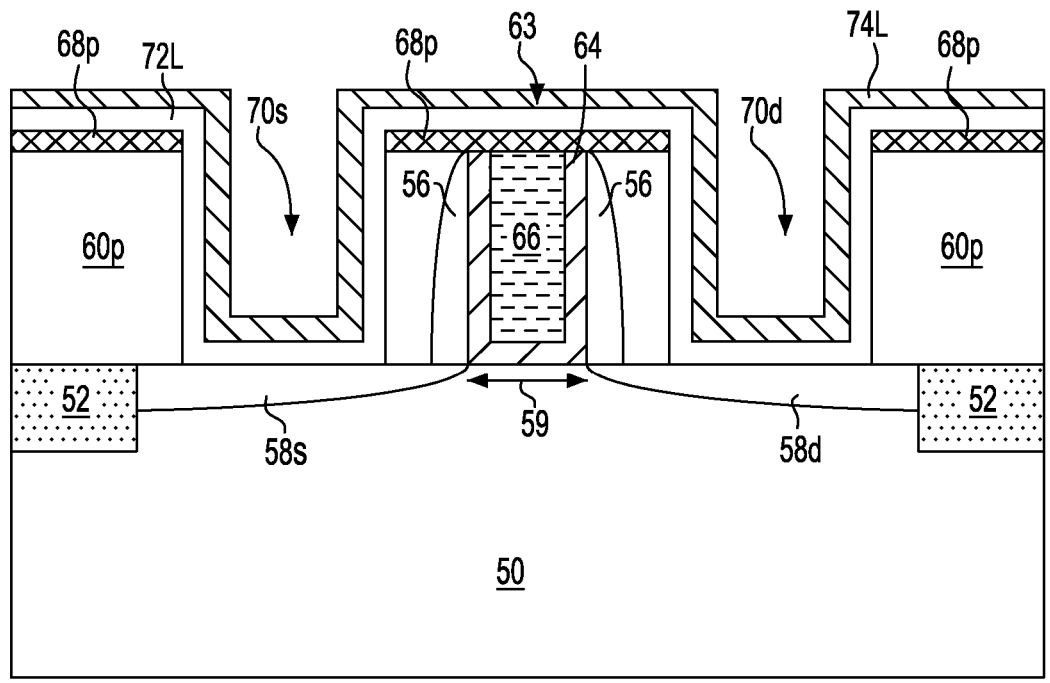
FIG. 17 is a cross sectional view of the second exemplary semiconductor structure of FIG. 16 after forming a second transition metal liner on an uppermost surface of the first transition metal liner.

Referring now to FIG. 17, there is illustrated the second exemplary semiconductor structure of FIG. 16 after forming a second transition metal liner 74L on an uppermost surface first transition metal liner 72L. The second transition metal liner 74L is a contiguous layer. The second transition metal liner 74L that is employed in this embodiment of the present application is the same as the second transition metal liner 34L previously described above. Notably, the second transition metal liner 72L comprises at least one second transition metal element that is (are) different from the at least one first transition metal element that provides the first transition metal liner 72L. The second transition metal liner 74L of this embodiment of the present application can be formed utilizing one of the techniques mentioned above in forming the second transition metal liner 34L. The thickness of the second transition metal liner 74L employed in this embodiment of the present disclosure is within the thickness range mentioned above for second transition metal liner 34L.

Figure 18:
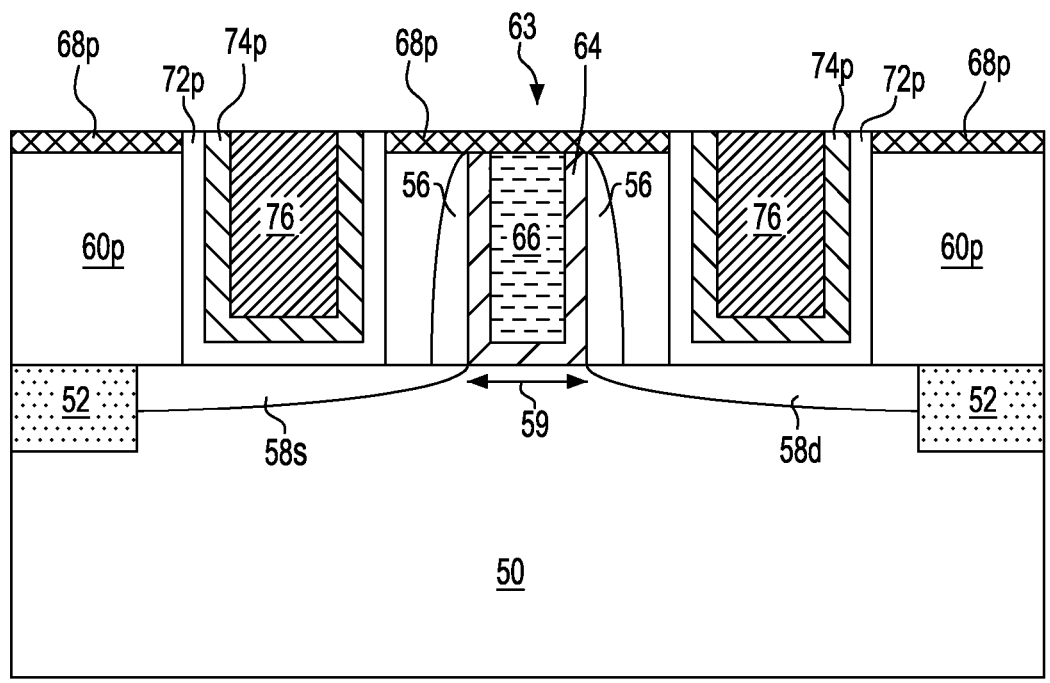
FIG. 18 is a cross sectional view of the second exemplary semiconductor structure of FIG. 17 after filling remaining portions of each contact opening with a contact metal and performing a planarization process.

Referring now to FIG. 18, there is illustrated the second exemplary semiconductor structure of FIG. 17 after filling remaining portions of each contact opening with a contact metal and performing a planarization process. The contact metal includes a conductive material that differs from either the at least one first transition metal that provides the first transition metal liner 72L and the at least one second transition metal that provides the second transition metal liner 74L. Exemplary contact metals that can be used in the present application include at least one of copper, tungsten, and aluminum. In one embodiment, the contact metal that fills each contact opening 70s, 70d comprises copper or a copper alloy such as, for example, a copper-aluminum alloy. The conductive material used in providing the contact metal may be formed by a deposition process including chemical vapor deposition (CVD), plasma enhanced chemical vapor deposition (PECVD), sputtering, or chemical solution deposition. Alternatively, a plating process that fills each contact opening 70s, 70d from the bottom upwards can be used.

After depositing the conductive material used in providing the metal contact, a planarization process such as, for example, chemical mechanical polishing (CMP) and/or grinding, can be employed to remove portions of the conductive metal, the second transition metal liner 74L and the first transition metal liner 72L that extends outride and above the mouth of each contact opening 70s, 70d. In some embodiments, the planarization step can stop on an uppermost surface of each dielectric cap material portion 68p. In another embodiment, the planarization step can remove each dielectric cap material portion 60p from the structure. The portions of the second transition metal liner 74L and the first transition metal liner 72L that remain after the planarization process are referred to herein as a second transition metal portion 74p and the first transition metal portion 72p, respectively. The remaining portion of the contact metal is labeled as element 76 in the drawing of the present application. As is shown, and after planarization, and uppermost surface of the contact metal 76 is coplanar with an uppermost surface of both the first and second transition metal portions 72p, 74p.

Figure 19:
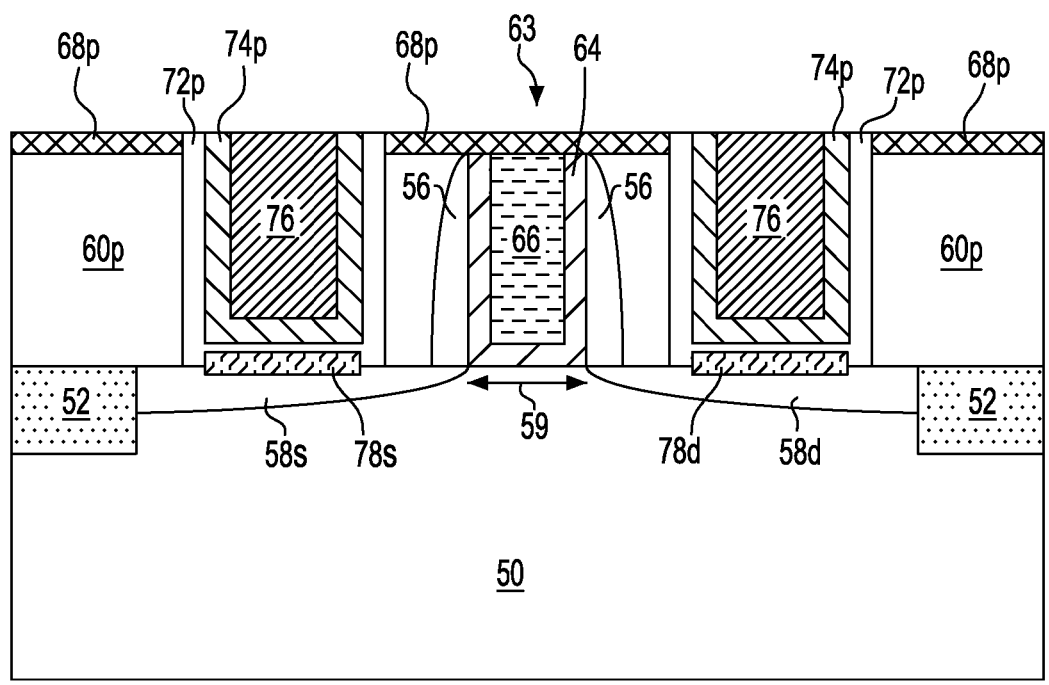
FIG. 19 is a cross sectional view of second exemplary semiconductor structure of FIG. 18 after performing an anneal process in which a source-side metal semiconductor alloy contact comprising the at least one first transition metal element, the at least one second transition metal element and a semiconductor element is formed at the bottom of one of the contact openings and on one side of the at least one functional gate structure, and a drain-side metal semiconductor alloy contact comprising the at least one first transition metal element, the at least one second transition metal element and a semiconductor element is formed at the bottom of another of the contact openings and on another side of the at least one functional gate structure.

Referring now to FIG. 19, there is illustrated the second exemplary semiconductor structure of FIG. 18 after performing an anneal process in which a source-side metal semiconductor alloy contact 78s comprising the at least one first transition metal element, the at least one second transition metal element and a semiconductor element is formed at the bottom of one of the contact openings 70s and on one side of the at least one functional gate structure 58, and a drain-side metal semiconductor alloy contact 78d comprising the at least one first transition metal element, the at least one second transition metal element and a semiconductor element is formed at the bottom of another of the contact openings 70d and on another side of the at least one functional gate structure 63.

The source-side metal semiconductor alloy contact 78s and the drain-side metal semiconductor alloy contact 78d each comprise the at least one first transition metal element of the first transition metal liner 72L, the at least one second transition metal element of the second transition metal liner 74L and a semiconductor element from the semiconductor substrate. In one embodiment, and when the semiconductor substrate 50 comprises silicon, the source-side metal semiconductor alloy contact 78s and the drain-side metal semiconductor alloy contact 78d each comprise a silicide comprising the at least one first transition metal element of the first transition metal liner 72L, and the at least one second transition metal element of the second transition metal liner 74L. In one example, and when the semiconductor substrate 50 comprises silicon, the source-side metal semiconductor alloy contact 78s and the drain-side metal semiconductor alloy contact 78d each comprise a silicide of Ni, Pt and Ti. In another embodiment, and when the semiconductor substrate 50 comprises germanium, the source-side metal semiconductor alloy contact 78s and the drain-side metal semiconductor alloy contact 78d each comprise a germide comprising the at least one first transition metal element of the first transition metal liner 72L, and the at least one second transition metal element of the second transition metal liner 74L. In one example, and when the semiconductor substrate 50 comprises germanium, the source-side metal semiconductor alloy contact 78s and the drain-side metal semiconductor alloy contact 78d each comprise a germanide of Ni, Pt and Ti.

As is shown, the source-side metal semiconductor alloy contact 78s and the drain-side metal semiconductor alloy contact 78d are located at the bottom of each contact opening 70s, 70d and a portion of each extends into the corresponding source/drain regions. The source-side metal semiconductor alloy contact 78s and the drain-side metal semiconductor alloy contact 78d each have an uppermost surface that is located above the uppermost surface of the semiconductor substrate 50, and a bottommost surface that is located beneath the uppermost surface of the semiconductor substrate 50. Furthermore, each of the source-side and the drain-side metal semiconductor alloy contacts 78s, 78d is embedded within a remaining portion of the first transition metal liner 72p.

In one embodiment of the present application, a laser anneal is used to form the structure shown in FIG. 19. When a laser anneal is employed, any of the above laser anneal condition used in providing the structure shown in FIG. 9 can be used in this embodiment of the present application. During the annealing process, the at least one first transition metal from the first transition metal liner 72L, and the at least one second transition metal from the second transition metal liner 74L diffusion into the semiconductor material portions of the source region 58s and the drain region 58d forming the metal semiconductor alloy contact 78s, 78d described above. The source-side metal semiconductor alloy contact 78s and the drain-side metal semiconductor alloy contact 78d each have a thickness from 2 nm to 20 nm. Some thinning of a horizontal portion of the first transition metal liner portion 72p may occur as shown in the drawing.

FIG. 19 illustrates one semiconductor structure that can be formed in the present application. The semiconductor structure shown in FIG. 19 includes a semiconductor substrate 50 having a source region 58s and a drain region 58d located within a semiconductor material portion of the semiconductor substrate 50, wherein the source region 58s and the drain region 58d are spaced apart by a channel region 59. A functional gate structure 63 is located above the channel region 59. A dielectric material 60 or 60p is located on each side of the functional gate structure 53. A contact opening 70s, 70d is located in each dielectric material 60 or 60p and extending to the source region 58s or the drain region 58d. A source-side metal contact structure (72p, 74p, 76 and 78s) is located within one of the contact openings 70s, and a drain-side metal contact structure (72p, 74p, 76 and 78d) is located within another of the contact openings 70d. Each of the source-side metal contact structure and the drain-side metal contact structure comprises a first transition metal liner 72p comprising at least one first transition metal element lining at least sidewalls of the contact opening 70s, 70d, a second transition metal liner 74p located on a surface of the first transition metal liner 72p and comprising at least one second transition metal element that is different from the at least one first transition metal element, a metal contact 76 located on a surface of the second transition metal liner 74p, and a metal semiconductor alloy contact 78s, 78d located at a bottom of the opening 70s, 70d and forming an interface with a portion of the source region 58s or the drain region 58d. In accordance with the present application, each of the metal semiconductor alloy contacts 78s, 78d comprises the at least one first transition metal element, the at least one second transition metal element and a semiconductor element of the semiconductor substrate 50.

The method of the present application that is used in forming the metal semiconductor alloy contacts is not limited to the specific examples mentioned above. Instead, the method of the present application can be used in any other processing schemes including, for example, formation of FinFET and semiconductor nanowire devices. In addition, the method of the present application can be used in forming metal semiconductor alloy contacts to any other type of semiconductor device such as, for example, a hetero-bipolar junction transistor (HBT).

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a metal contact structure, said method comprising:
   providing a structure including at least one contact opening in a dielectric material that extends to an uppermost surface of a semiconductor substrate;
   forming a first transition metal liner comprising at least one first transition metal element in said at least one contact opening;
   forming a second transition metal liner on a surface of said first transition metal liner and comprising at least one second transition metal element that is different from said at least one first transition metal element;
   forming a metal contact on a surface of said second transition metal liner; and
   annealing said structure to form a metal semiconductor alloy contact at a bottom of said at least one contact opening, wherein said metal semiconductor alloy contact forms an interface with a portion of said semiconductor substrate and comprises said at least one first transition metal element formed from a portion of said first transition metal liner, said at least one second transition metal element formed from a portion of said second transition metal liner, and a semiconductor element of said semiconductor substrate.

2. The method of claim 1, wherein said at least one first transition metal element and said at least one second transition metal element comprise a metal selected from Groups 4-10 of the Periodic Table of Elements.

3. The method of claim 2, wherein said at least one first transition metal element comprises NiPt and said at least one second transition metal element comprises Ti, W or Hf.

4. The method of claim 2, wherein said at least one first transition metal element comprises Ti, W, of Hf and said at least one second transition metal element comprises NiPt.

5. The method of claim 1, wherein said annealing comprises a laser anneal performed at a temperature from 800° C. to 1100° C.

6. The method of claim 5, wherein said laser anneal comprises a $CO_2$ laser.

7. The method of claim 6, wherein said $CO_2$ laser is used in conjugation with an InGaAs laser.

8. The method of claim 1, further comprising forming a functional gate structure on a portion of said uppermost surface of said semiconductor substrate prior to forming said contact opening in said dielectric material.

9. The method of claim 8, wherein said forming said functional gate structure comprises:
   forming a material stack comprising, from bottom to top, a gate dielectric and gate conductor on said portion of said uppermost surface of said semiconductor substrate prior to forming said dielectric material; and
   patterning said material stack by lithography and etching.

10. The method of claim 8, wherein said forming said functional gate structure comprises:
    forming a sacrificial gate structure on said portion of said uppermost surface of said semiconductor substrate prior to forming said dielectric material;
    forming said dielectric material, wherein an uppermost surface of said sacrificial gate structure is exposed;
    removing said sacrificial gate structure to provide a gate cavity;
    filling a portion of said gate cavity with a dielectric material; and
    filling a remaining portion of said gate cavity with a gate conductor.

11. The method of claim 1, further comprising forming a dielectric cap material on said dielectric material prior to forming said contact opening in said dielectric material.

12. The method of claim 1, wherein said forming said contact opening in said dielectric material comprises lithography and etching.

13. The method of claim 1, wherein said forming said first transition metal liner comprises a deposition process selected from chemical vapor deposition, plasma enhanced chemical vapor deposition, platting and sputtering.

14. The method of claim 1, wherein said forming said first transition metal liner comprises a co-deposition process.

15. The method of claim 1, wherein said first transition metal liner is a contiguous layer that is present within said contact opening and atop said dielectric material.

16. The method of claim 15, wherein said second transition metal liner is a contiguous layer that is present within said contact opening and atop said dielectric material.

17. The method of claim 16, wherein after said forming said metal contact, portions of said second transition metal liner, said first transition metal liner and said metal contact are removed from atop said dielectric material by utilizing a planarization process.

18. The method of claim 1, wherein said forming said second transition metal liner comprises a deposition process selected from chemical vapor deposition, plasma enhanced chemical vapor deposition, platting and sputtering.

19. The method of claim 1, wherein said forming said second transition metal liner comprises a co-deposition process.

20. The method of claim 1, wherein during said annealing, thinning of a horizontal portion of the first transition liner occurs.

* * * * *